United States Patent
Datta

(10) Patent No.: US 6,222,156 B1
(45) Date of Patent: *Apr. 24, 2001

(54) LASER REPAIR PROCESS FOR PRINTED WIRING BOARDS

(75) Inventor: Saswati Datta, Binghamton, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/453,809

(22) Filed: Dec. 3, 1999

Related U.S. Application Data

(62) Division of application No. 08/873,682, filed on Jun. 12, 1997, now Pat. No. 6,046,429.

(51) Int. Cl.[7] ................................................ B23K 26/00
(52) U.S. Cl. .......................................................... 219/121.68
(58) Field of Search ........................... 219/121.6, 121.68, 219/121.75, 121.73, 121.83

(56) References Cited

U.S. PATENT DOCUMENTS

| | | |
|---|---|---|
| 4,399,345 | 8/1983 | Lapham et al. . |
| 4,444,801 | 4/1984 | Hongo et al. . |
| 4,467,172 * | 8/1984 | Ehrenwald et al. ............ 219/121.68 |
| 4,536,949 * | 8/1985 | Takayama et al. .................. 438/601 |
| 4,670,639 | 6/1987 | Behn . |
| 4,705,698 | 11/1987 | Dine . |
| 4,976,930 * | 12/1990 | Kishida et al. ................... 422/186.3 |
| 5,021,362 * | 6/1991 | Chlipala ................................... 438/7 |
| 5,026,624 | 6/1991 | Day et al. . |
| 5,208,437 | 5/1993 | Miyauchi et al. . |
| 5,236,551 | 8/1993 | Pan . |
| 5,265,114 | 11/1993 | Sun et al. . |
| 5,283,417 * | 2/1994 | Misawa et al. ................... 219/101.85 |
| 5,296,674 | 3/1994 | Praschek et al. . |
| 5,300,402 | 4/1994 | Card, Jr. et al. . |
| 5,300,756 * | 4/1994 | Cordingley ...................... 219/121.69 |
| 5,319,183 | 6/1994 | Hosoya et al. . |
| 5,365,034 | 11/1994 | Kawamura et al. . |
| 5,466,908 | 11/1995 | Hosoya et al. . |
| 5,494,781 | 2/1996 | Ohtani et al. . |
| 5,611,946 * | 3/1997 | Leong et al. ....................... 219/121.6 |
| 5,670,068 * | 9/1997 | Kuriyama et al. .............. 219/121.68 |
| 5,844,199 * | 12/1998 | Iino et al. ....................... 219/121.67 |

FOREIGN PATENT DOCUMENTS

| | | |
|---|---|---|
| 0642158 | 3/1995 | (EP) . |
| 5-42382 * | 2/1993 | (JP) . |
| 8-172063 * | 7/1996 | (JP) . |

OTHER PUBLICATIONS

D.L. Klein, P.A. Leary–Renick & Srinivasan, Ablative Photodecomposition Process for Repair of Line Shorts, Feb. 1984, pp 4669–4671.

* cited by examiner

Primary Examiner—Samuel M. Heinrich
(74) Attorney, Agent, or Firm—McGuireWoods, LLP; Lawrence R. Fraley, Esq.

(57) ABSTRACT

A method of repairing wiring shorts on a surface of an organic layer. The organic layer, which is preferably a SLC/ASM layer, may be a surface layer of a Printed Circuit (PC) board. The absorption spectrum of the organic layer is examined. Based on that absorption spectrum, a laser is selected with a wavelength such that the surface layer slightly absorbs, 1–10%, laser energy striking it. Thus, the laser removes metal on the surface, while slightly etching the surface layer and without effect on any metal buried in or beneath the surface layer. Preferably, the laser is an Nd:YAG laser having a wavelength in a range where the ASM layer absorption is between 2–5%, and the copper ablation rate is high.

4 Claims, 2 Drawing Sheets

LASER REPAIR PROCESS FOR PRINTED WIRING BOARDS

This is a divisional application of application Ser. No. 08/873,682 filed on Jun. 12, 1997 and now allowed as U.S. Pat. No. 6,046,429.

FIELD OF THE INVENTION

The present invention generally relates to methods of repairing printed circuit board wiring and in particular to laser ablation repair methods of repairing shorts on printed circuit boards and both organic and inorganic chip carriers.

BACKGROUND OF THE INVENTION

Printed Circuit (PC) boards, also called printed wiring boards, are known in the art. Integrated Circuit (IC) chips are mounted on PC boards and interconnected through PC board wiring. These IC chips may be packaged and, the packaged chips mounted on a board or, to achieve higher chip density, chips may be mounted directly onto the board.

To further increase the number of chips that may be mounted on PC boards, such as state of the art Surface Laminar Circuit (SLC) boards, narrower wires are crowded closer together on each wiring layer to wedge more and more wires into smaller and smaller areas. Currently, the space between wires is about 5 mils (12.5 µm). One result of increasing wiring density is a corresponding increase in PC board costs.

So, to control PC board costs and to reduce waste, defective PC boards are repaired, whenever possible. Excimer lasers, which are expensive and difficult to maintain, are normally used to repair surface wiring on ceramic substrates.

However, a typical excimer laser used to repair a short on a ceramic surface would pass through an organic surface layer of an SLC board, damaging underlying wiring. Also, Xenon lasers with a wavelength in the blue–green range (450–570 nm) have been found to pass through an organic surface layer, damaging any underlying wires.

Thus, these types of lasers may not be used to repair defects (especially shorts) in dense SLC surface wiring. Instead, shorts are repaired on SLCs, typically, by cutting them with a knife (manually) or with an ultrasonic cutter.

Unfortunately, cutting the short may also damage the PC board being repaired. The knife may slip and damage the SLC. Further, as wiring density increases, cutting becomes very difficult. So, for dense wiring on an organic insulator, such as an SLC, manual repair is inconsistent at best.

Thus, there is a need for a method of removing shorts on densely wired PC boards, such as SLCs.

PURPOSES OF THE INVENTION

It is therefore a purpose of the present invention to improve densely wired PC board yield;

It is another purpose of the present invention to reduce the cost of densely wired PC boards;

It is yet another purpose of the present invention to simplify wiring short removal on densely wired PC boards.

SUMMARY OF THE INVENTION

The present invention is method of selectively trimming metal from a surface layer of an insulator material without damaging wiring buried in or beneath the material. A laser is selected with a wavelength such that it is partially absorbed between 1–10% by the dielectric material. Preferably, it is absorbed between 2–5%. Thus, when the metal is ablated or etched from the dielectric surface, etching continues slightly into the surface. However, the laser is prevented from completely etching through or passing through the dielectric, and inadvertently ablating metal therein or thereunder.

In the preferred embodiment, a 266–380 nm, and preferably a 355 nm, Nd:YAG laser is used to ablate copper or copper/metal shorts on an Advanced Solder Mask (ASM) dielectric surface.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF A PREFERRED EMBODIMENT

A dielectric known as Advanced Solder Mask (ASM) is a photosensitive dielectric material that may be patterned directly to form through-holes, known as vias, that connect wiring layers at opposite surfaces of an ASM layer. ASM material is described in U.S. Pat. No. 5,026,624 entitled "Composition for Photo Imaging" to Day et al., and in U.S. Pat. No. 5,300,402 entitled "Composition for Photo Imaging" to Card et al., both assigned to the assignee of the present invention and incorporated herein by reference. Surface Laminar Circuit (SLC) boards made from ASM (SLC/ASM) exhibit a dramatic increase in wiring density over other SLCs, because very small vias may be formed with very high precision.

The inventor has discovered that laser ablation may be used to successfully repair or modify copper wiring formed on an SLC/ASM surface by selecting a laser that is slightly absorbed (1–10%) by the ASM material. Thus, the ASM material is neither reflective, transparent, nor fully absorbing, but mildly absorbing, between 1–10% and preferably between 2–5%. As a result, after metal is ablated from the surface, just enough laser energy is absorbed, slightly etching the ASM surface, to prevent destructively ablating underlying metal layers.

Figure 1:
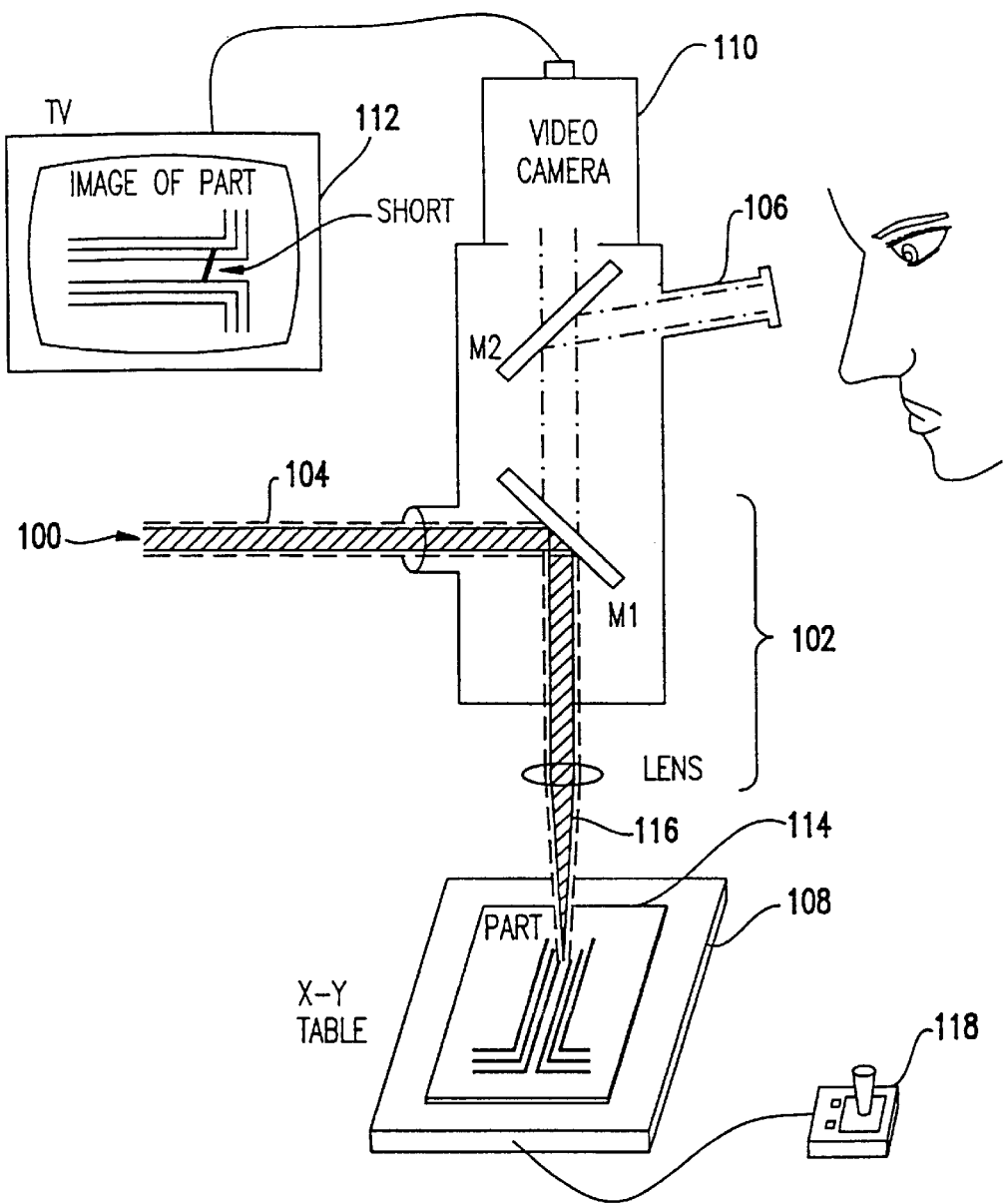
FIG. 1 represents a PC board repair system according to the present invention.

FIG. 1 represents an SLC/ASM repair apparatus according to the present invention. It includes a laser 100, a lens arrangement 102, illumination 104, an optical viewer 106 and a work surface 108. Optionally, a video camera 110 and monitor 112 may be included.

The laser 100 has a wavelength bandwidth such that an appropriate wavelength may be selected, depending on the material of the workpiece 114, in this example ASM, to exhibit a small degree (1–10%) of absorption while maintaining a high metal ablation rate. Preferably, the degree of absorption of the workpiece material is 2–5%. The laser 100 power level is modulated at a sufficient level to ablate metal on the work piece 114 surface.

The lens arrangement 102 focuses the laser onto the workpiece 114. The workpiece 114 is illuminated sufficiently that the workpiece 114 may be viewed either directly, through the optical viewer 106 or, on the monitor 112 as work progresses on the workpiece 114. The optical viewer and optional camera may also be used for examination/verification of completed work on the workpiece 114. The work surface is movable to precisely place the target area (e.g. a wiring short) directly beneath the focused laser 116, so that the target may be removed (the short ablated) without damaging adjacent wiring. A joystick 118 may be used to manually control movement of the work surface 108. The apparatus of FIG. 1 may be used to remove wiring shorts or to effect simple Engineering Changes (ECs).

Preferably, the apparatus of FIG. 1 is used for repairing wiring on SLC/ASM boards. However, the apparatus may also be used, for example, for repairing or ECing organic laminate chip carriers, flexible laminate based cables, or any similar arrangement.

The absorption spectrum of ASM material was examined to determine that a Nd:YAG laser with a 266–380 nm wavelength and, preferably 355 nm, would incur 1–10% absorption, while maintaining a high degree of ablation for copper wiring. While one preferred laser is an Nd:YAG laser, there are many comparable diode lasers that may be used. Selection of one of these other lasers is appropriate, provided it has a wavelength and that would incur 1–10% absorption by the dielectric, while maintaining a high degree of ablation for wiring. Preferably, for deleting shorts 25 $\mu$m wide or smaller, the laser pulse width is 1 ns and focused to a 5–10 $\mu$m spot.

As metal, preferably copper, is removed from the ASM surface, laser energy striking the bare surface is partially absorbed by ASM dielectric, which causes slight etching of the board surface. Although a slight amount of ASM material is etched away by the laser, the laser does not penetrate the layer with sufficient intensity to damage metal circuitry buried in or under the ASM layer. So, after ablating the short, additional laser pulses may be directed at the defect area, for insurance, to improve the level of confidence in the repair, without damaging the board or other wiring as in prior art repair methods. Thus, a surface short is easily removed with only superficial damage to the ASM surface layer and no damage to any underlying layer.

So, using the arrangement of FIG. 1, metal is ablated from the surface of an SLC/ASM to expose the ASM layer thereunder which absorbs any excess laser radiation. Laser energy striking the SLC surface may etch the ASM layer, slightly, but the laser energy is attenuated and prevented from penetrating the ASM layer with sufficient energy to damage subsurface wiring or components.

Figure 2:
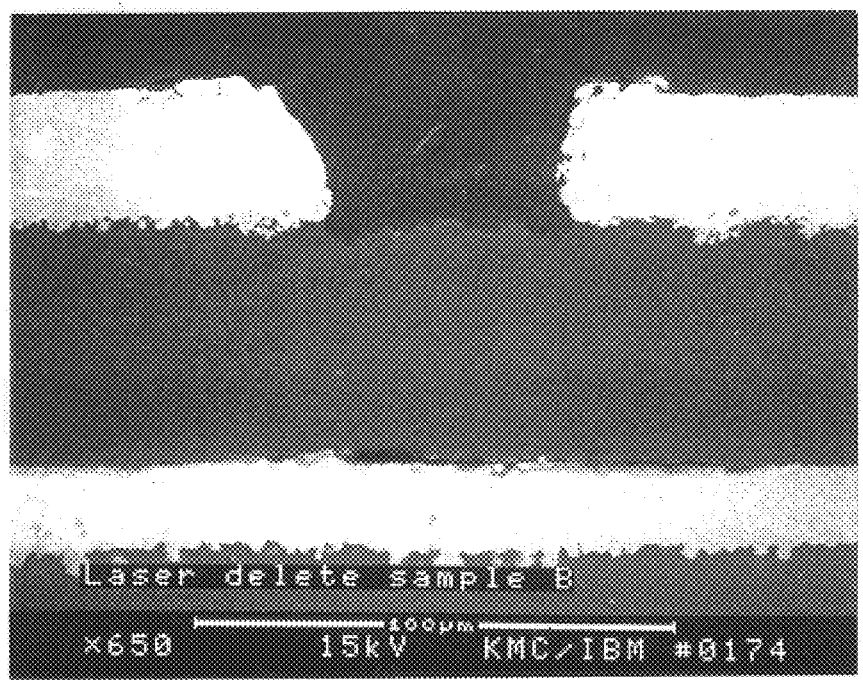
FIG. 2 is a reproduction of a SEM photo of a cross section of a repair area, repaired according to the prior art.

FIG. 2 is a reproduction of a Scanning Electron Microscope (SEM) photograph of a cross-section of a repair area, using a prior art repair method. In FIG. 2, a xenon laser was used to ablate a copper surface line on ASM material. The laser passed through the underlying ASM material, causing the internal copper line to expand. This repaired board might test good and appear acceptable. However, once in use, it would fail, causing system down-time and a potentially expensive repair.

Figure 3:
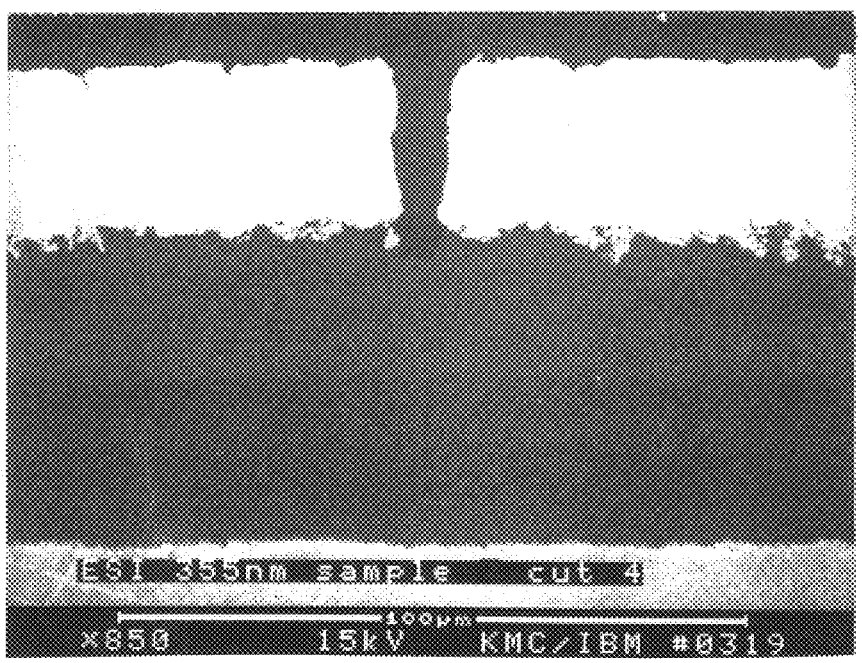
FIG. 3 is a reproduction of a SEM photo of a cross section of a repair area, repaired according to the preferred embodiment of the present invention.

FIG. 3 is a reproduction of an SEM photo of a cross section of an identical repair area, repaired according to the preferred embodiment of the present invention. A preferred 355 nm Nd:YAG laser deleted an identical copper line. The internal copper line is undamaged because just enough of the laser was absorbed by the ASM layer to prevent ablating the internal line.

While the invention has been described in terms of a single preferred embodiment, those skilled in the art will recognize that the invention can be practiced with modification within the spirit and scope of the appended claims.

What is claimed is:

1. An arrangement for repairing wiring shorts in printed wiring on an insulating layer, said arrangement comprising:

a workpiece having said insulating layer formed thereon;

a laser having a wavelength between 255 and 355 nm, wherein the degree of absorption of said insulating layer is 1–10%;

means for focusing said laser on a target area of said workpiece, said target area being a top surface of said insulating layer;

means for holding said workpiece and locating said target beneath said focused laser; and means for viewing a short in said target area beneath said focused laser in said target area, wherein said laser is selected to remove shorts from coplanar wiring on the top surface of said insulation layer by laser ablation without damaging metal circuitry buried in or under the insulating layer.

2. The arrangement of claim 1 wherein said degree of absorption is between 2–5%.

3. The arrangement of claim 2 wherein said laser is a Nd:YAG laser.

4. The arrangement of claim 3 wherein said Nd:YAG laser has a 355 nm wavelength.

* * * * *